(12) United States Patent
Miura et al.

(10) Patent No.: US 9,050,616 B2
(45) Date of Patent: Jun. 9, 2015

(54) SUBSTRATE TREATMENT APPARATUS AND SUBSTRATE TREATMENT METHOD

(71) Applicant: DAINIPPON SCREEN MFG. CO., LTD., Kyoto (JP)

(72) Inventors: Atsuyasu Miura, Kyoto (JP); Hiroaki Ishii, Kyoto (JP)

(73) Assignee: SCREEN Holdings Co., Ltd (JP)

( * ) Notice: Subject to any disclaimer, the term of this patent is extended or adjusted under 35 U.S.C. 154(b) by 0 days.

(21) Appl. No.: 13/849,603

(22) Filed: Mar. 25, 2013

(65) Prior Publication Data

US 2013/0256273 A1 Oct. 3, 2013

(30) Foreign Application Priority Data

Mar. 29, 2012 (JP) ................. 2012-078182

(51) Int. Cl.
*H01L 21/302* (2006.01)
*H01L 21/461* (2006.01)
*B05B 12/08* (2006.01)
*B05D 1/02* (2006.01)
*B05D 7/24* (2006.01)
*H01L 21/67* (2006.01)
*H01L 21/311* (2006.01)
*H01L 21/3213* (2006.01)
*H01L 21/306* (2006.01)

(52) U.S. Cl.
CPC . *B05B 12/08* (2013.01); *B05D 1/02* (2013.01); *B05D 7/24* (2013.01); *H01L 21/31111* (2013.01); *H01L 21/32134* (2013.01); *H01L 21/30604* (2013.01); *H01L 21/67051* (2013.01); *H01L 21/6708* (2013.01); *H01L 21/67248* (2013.01)

(58) Field of Classification Search
CPC ............... H01L 21/6708; H01L 21/32134; H01L 21/31133; H01L 21/31111; H01L 21/67051; H01L 21/02087; H01L 21/67248
See application file for complete search history.

(56) References Cited

U.S. PATENT DOCUMENTS

| | | | |
|---|---|---|---|
| 6,544,111 B1 * | 4/2003 | Kimura et al. ............. | 451/288 |
| 2002/0025375 A1 * | 2/2002 | Takamori et al. ........... | 427/240 |
| 2010/0279435 A1 * | 11/2010 | Xu et al. .................... | 438/5 |
| 2012/0067847 A1 * | 3/2012 | Sakurai et al. ............. | 216/83 |

FOREIGN PATENT DOCUMENTS

| | | |
|---|---|---|
| JP | 2006-344907 | 12/2006 |
| JP | 2007-220989 | 8/2007 |
| JP | 2011-211092 | 10/2011 |

* cited by examiner

Primary Examiner — Duy Deo
(74) Attorney, Agent, or Firm — Ostrolenk Faber LLP

(57) ABSTRACT

A substrate treatment apparatus includes: a chamber; a substrate being treated with a treatment liquid in the chamber; a temperature measuring unit which measures an internal air temperature of the chamber and/or a temperature of the treatment liquid; a temperature adjusting unit which changes the internal air temperature and/or the temperature of the treatment liquid; a storage unit which stores a map defining a relationship between the air temperature and the treatment liquid temperature so that a treatment liquid temperature level for a given air temperature level is lower than the given air temperature level; and a temperature controlling unit which sets a target value of the internal air temperature of the chamber or the temperature of the treatment liquid based on the map and a measurement value detected by the temperature measuring unit, and controls the temperature adjusting unit based on the target value.

4 Claims, 2 Drawing Sheets

SUBSTRATE TREATMENT APPARATUS AND SUBSTRATE TREATMENT METHOD

BACKGROUND OF THE INVENTION

1. Field of the Invention

The present invention relates to a substrate treatment apparatus and a substrate treatment method for treating a substrate. Examples of the substrate to be treated include semiconductor wafers, substrates for liquid crystal display devices, substrates for plasma display devices, substrates for FED (Field Emission Display) devices, substrates for optical disks, substrates for magnetic disks, substrates for magneto-optical disks, substrates for photo masks, ceramic substrates and substrates for solar cells.

2. Description of Related Art

In production processes for semiconductor devices, liquid crystal display devices and the like, substrate treatment apparatuses are used for treating substrates such as semiconductor wafers and glass substrates for the liquid crystal display devices.

A substrate treatment apparatus of a single substrate treatment type disclosed in JP-2006-344907A includes a spin chuck which horizontally holds and rotates a substrate, and a nozzle which spouts a treatment liquid having a temperature higher than a room temperature toward a center portion of an upper surface of the rotating substrate. The higher-temperature treatment liquid spouted from the nozzle reaches the center portion of the upper surface of the substrate and then spreads outward on the substrate by a centrifugal force. Thus, the higher-temperature treatment liquid is supplied over the entire upper surface of the substrate.

The higher-temperature treatment liquid supplied to the center portion of the rotating substrate is moved from the center portion of the substrate to a peripheral portion of the substrate by the centrifugal force. During the movement of the treatment liquid, the heat of the treatment liquid is removed by the substrate, so that the temperature of the treatment liquid is reduced. Further, the treatment liquid is partly evaporated while removing heat from the ambient environment during the outward movement of the treatment liquid on the substrate. Accordingly, the temperature of the treatment liquid is further reduced. The treatment liquid is more liable to be evaporated on the peripheral portion of the substrate than on the center portion of the substrate. This is because a speed at a given position of the rotating substrate is increased as a distance between the given position and the rotation axis of the substrate increases. Therefore, the treatment liquid has a lower temperature on the peripheral portion of the substrate than on the center portion of the substrate. Further, the peripheral portion of the substrate has a higher speed than the center portion of the substrate and, therefore, is more liable to be cooled than the center portion of the substrate. With such and other factors, the treatment liquid has a lower temperature on the peripheral portion of the substrate than on the center portion of the substrate, so that the uniformity of the temperature of the treatment liquid on the substrate is reduced. This reduces the uniformity of the treatment.

JP-2007-220989A discloses a method in which a cleaning liquid having a temperature lower by 1.0° C. to 5.0° C. than an ambient temperature is supplied to a lower surface of a substrate. In the method of JP-2007-220989A, however, it is impossible to uniformly treat the entire lower surface of the substrate, because the cleaning liquid is supplied only to the peripheral portion of the lower surface of the substrate.

SUMMARY OF THE INVENTION

It is an object of the present invention to provide a substrate treatment apparatus and a substrate treatment method which enhance the uniformity of a treatment.

The present invention provides a substrate treatment apparatus, which includes: a chamber; a substrate holding/rotating unit which horizontally holds a substrate in the chamber and rotates the substrate about a vertical rotation axis extending through the substrate; a treatment liquid supplying unit which spouts a treatment liquid toward a center portion of the substrate held by the substrate holding/rotating unit; a temperature measuring unit which measures at least one of an internal air temperature of the chamber and a temperature of the treatment liquid to be spouted from the treatment liquid supplying unit; a temperature adjusting unit which changes at least one of the internal air temperature of the chamber and the temperature of the treatment liquid to be spouted from the treatment liquid supplying unit; a storage unit which stores a map defining a relationship between the air temperature and the treatment liquid temperature so that a treatment liquid temperature level for a given air temperature level is lower than the given air temperature level; and a temperature controlling unit which sets a target value of the internal air temperature of the chamber or the temperature of the treatment liquid to be spouted from the treatment liquid supplying unit based on the map and a measurement value detected by the temperature measuring unit, and controls the temperature adjusting unit so that the internal air temperature of the chamber or the temperature of the treatment liquid to be spouted from the treatment liquid supplying unit is adjusted closer to the target value. The treatment liquid may be a chemical liquid such as an etching liquid or a rinse liquid such as pure water (deionized water). A liquid other than the chemical liquid and the rinse liquid may be used as the treatment liquid.

With this arrangement, the treatment liquid spouted from the treatment liquid supplying unit is supplied to the center portion of the substrate horizontally held by the substrate holding/rotating unit in the chamber. The substrate holding/rotating unit rotates the substrate about the vertical rotation axis extending through the substrate. The treatment liquid supplied to the center portion of the rotating substrate is moved from the center portion of the substrate to a peripheral portion of the substrate by a centrifugal force. Thus, the treatment liquid is supplied over the entire substrate surface.

The temperature controlling unit sets the target value of the internal air temperature of the chamber or the temperature of the treatment liquid to be spouted from the treatment liquid supplying unit based on the map stored in the storage unit and the measurement value detected by the temperature measuring unit which measures at least one of the internal air temperature of the chamber and the temperature of the treatment liquid to be spouted from the treatment liquid supplying unit. Then, the temperature controlling unit controls the temperature adjusting unit which changes at least one of the internal air temperature of the chamber and the temperature of the treatment liquid to be spouted from the treatment liquid supplying unit, whereby the internal air temperature of the chamber or the temperature of the treatment liquid to be spouted from the treatment liquid supplying unit is adjusted closer to the target value (preferably adjusted to be equal to the target value). The treatment liquid is thus temperature-adjusted to satisfy the relationship defined in the map, and then supplied to the substrate.

In the map, a treatment liquid temperature level is correlated to an air temperature level higher than this treatment liquid temperature level. In other words, a treatment liquid temperature level for a given air temperature level is lower than the given air temperature level in the map. Therefore, a treatment liquid having a temperature lower than the internal air temperature of the chamber is spouted from the treatment liquid supplying unit and supplied to the center portion of the substrate. During the movement of the treatment liquid to the peripheral portion of the substrate, the heat of the treatment liquid supplied to the substrate is reduced due to the contact of the treatment liquid with the substrate or the evaporation of the treatment liquid. However, the internal air temperature of the chamber is higher than the temperature of the treatment liquid to be spouted from the treatment liquid supplying unit, so that the treatment liquid on the substrate is heated by an ambient atmosphere. Further, a period of contact between the treatment liquid and the ambient atmosphere is increased as the treatment liquid approaches the peripheral portion of the substrate. Accordingly, the amount of heat supplied to the treatment liquid from the ambient atmosphere is increased as the treatment liquid approaches the peripheral portion of the substrate. Therefore, the heat removed from the treatment liquid is compensated with the heat supplied from the ambient atmosphere. As a result, a difference in the temperature of the treatment liquid between the center portion and the peripheral portion of the substrate is reduced.

Where the internal air temperature of the chamber is higher than the temperature of the treatment liquid present on the substrate, the treatment liquid is heated by the ambient atmosphere. However, this promotes the evaporation of the treatment liquid, so that the amount of heat removed from the treatment liquid due to the evaporation is increased. In the present invention, however, the internal air temperature of the chamber is not simply kept at a temperature higher than the treatment liquid temperature, but the treatment liquid is supplied to the substrate in such a state that the internal air temperature of the chamber and the treatment liquid temperature satisfy the relationship defined in the map. This makes it possible to heat the treatment liquid present on the substrate by the ambient atmosphere while suppressing the evaporation of the treatment liquid. Thus, the uniformity of the temperature of the treatment liquid on the substrate can be enhanced, thereby enhancing the uniformity of the treatment.

The treatment liquid supplying unit may include at least one of an upper surface nozzle which spouts the treatment liquid toward a center portion of an upper surface of the substrate while being kept stationary and a lower surface nozzle which spouts the treatment liquid toward a center portion of a lower surface of the substrate while being kept stationary. The temperature measuring unit may include at least one of an air temperature measuring unit which measures the internal air temperature of the chamber and a liquid temperature measuring unit which measures the temperature of the treatment liquid to be spouted from the treatment liquid supplying unit. Similarly, the temperature adjusting unit may include at least one of an air temperature adjusting unit which changes the internal air temperature of the chamber and a liquid temperature adjusting unit which changes the temperature of the treatment liquid to be spouted from the treatment liquid supplying unit.

The temperature controlling unit may set the target value so that the internal air temperature of the chamber is higher by 2° C. than the temperature of the treatment liquid to be spouted from the treatment liquid supplying unit.

The present invention also provides a substrate treatment method, which includes a holding/rotating step of causing a substrate holding/rotating unit to horizontally hold a substrate in a chamber and rotate the substrate about a vertical rotation axis extending through the substrate; a treatment liquid supplying step of, simultaneously with the holding/rotating step, spouting a treatment liquid from a treatment liquid supplying unit toward a center portion of the substrate held by the substrate holding/rotating unit; a temperature measuring step of, before the treatment liquid supplying step, causing a temperature measuring unit to measure at least one of an internal air temperature of the chamber and a temperature of the treatment liquid to be spouted from the treatment liquid supplying unit; a target value setting step of, after the temperature measuring step, setting a target value of the internal air temperature of the chamber or the temperature of the treatment liquid to be spouted from the treatment liquid supplying unit based on a measurement value detected by the temperature measuring unit and a map which defines a relationship between the air temperature and the treatment liquid temperature so that a treatment liquid temperature level for a given air temperature level is lower than the given air temperature level; and a temperature controlling step of, before the treatment liquid supplying step, controlling the internal air temperature of the chamber or the temperature of the treatment liquid to be spouted from the treatment liquid supplying unit so that the internal air temperature or the treatment liquid temperature becomes closer to the target value.

The foregoing and other objects, features and effects of the present invention will become more apparent from the following detailed description of the preferred embodiments with reference to the attached drawings.

DETAILED DESCRIPTION OF THE PREFERRED EMBODIMENTS

Figure 1:
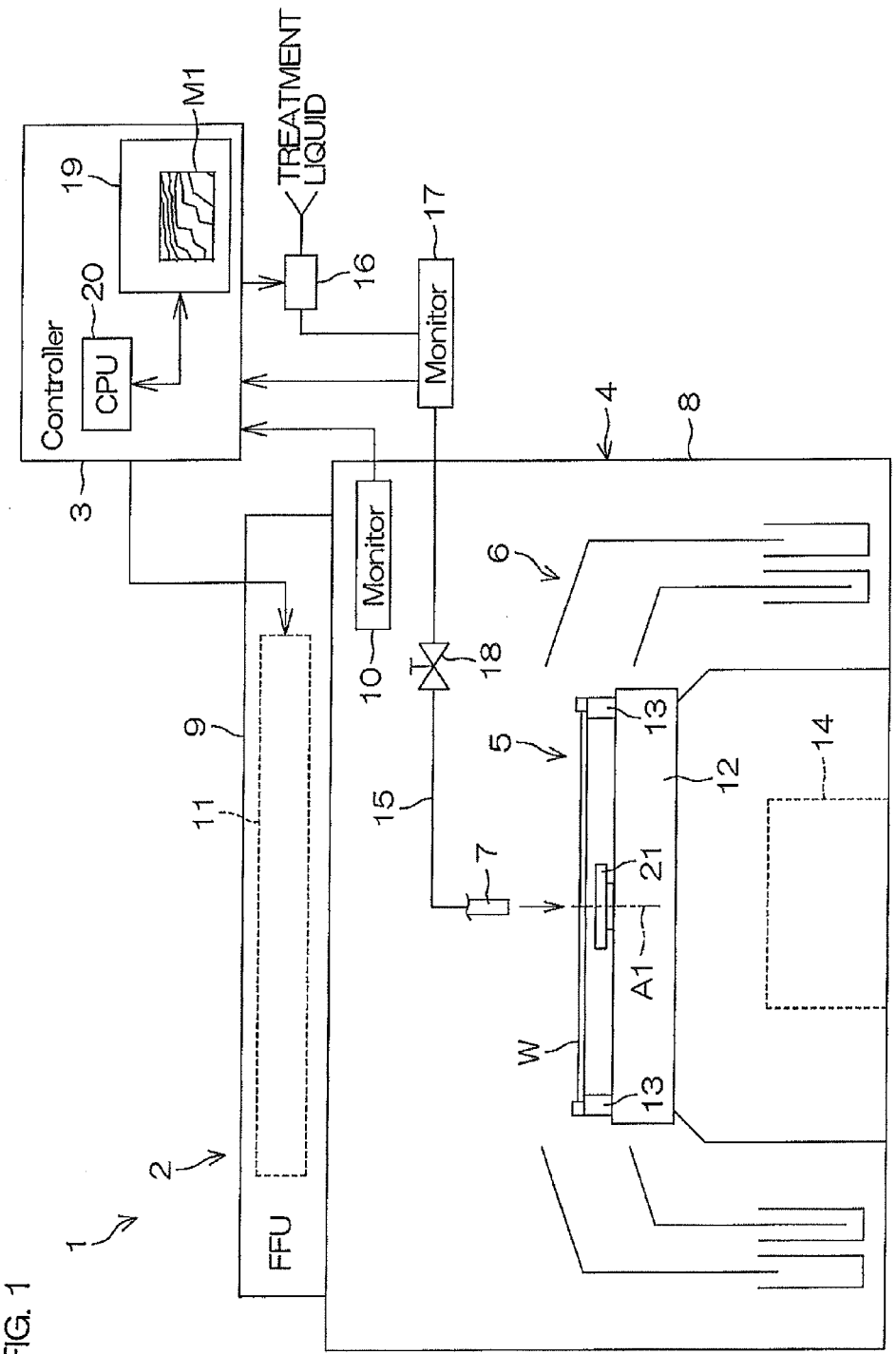
FIG. 1 is a schematic diagram showing the inside of a treatment unit provided in a substrate treatment apparatus according to an embodiment of the present invention.

FIG. 1 is a schematic diagram showing the inside of a treatment unit 2 provided in a substrate treatment apparatus 1 according to an embodiment of the present invention.

The substrate treatment apparatus 1 is of a single substrate treatment type which is adapted to treat a single disk-shaped substrate W (e.g., semiconductor wafer) at a time. The substrate treatment apparatus 1 includes a plurality of treatment units 2, and a controller 3 which controls operations of devices provided in the substrate treatment apparatus 1 and the opening and closing of valves.

The treatment units 2 each include a chamber 4, a spin chuck 5 which horizontally holds the substrate W in the chamber 4 and rotates the substrate W about a vertical rotation axis A1 extending through the center of the substrate W, a tubular cup 6 surrounding the spin chuck 5, and an upper surface nozzle 7 which spouts a treatment liquid toward a center portion of an upper surface of the substrate W. The spin chuck 4 is an example of the substrate holding/rotating unit. The upper surface nozzle 7 is an example of the treatment liquid supplying unit.

The chamber 4 includes a box-shaped partition wall 8, an FFU 9 (fan/filter unit 9) serving as an air feeding unit which feeds clean air to the inside of the partition wall 8 from the top of the partition wall 8, and an air temperature measuring device 10 (an example of the temperature measuring unit) which monitors the internal air temperature of the chamber 4. The FFU 9 is disposed on the top of the partition wall 8 and attached to the top of the partition wall 8. The air temperature measuring device 10 is disposed inside the partition wall 8. The FFU 9 takes room-temperature air (at 20° C. to 30° C.) therein from a clean room in which the substrate treatment apparatus 1 is installed, and adjusts the temperature of the air by means of an air temperature adjusting device 11 incorporated in the FFU 9 while filtering the air by a filter. The air temperature adjusting device 11 may be a heater or a cooler. The FFU 9 feeds the filtered air (clean air) into the chamber 4 from the top of the partition wall 8. Thus, the clean air temperature-adjusted at a predetermined temperature is fed into the chamber 4. Therefore, down flow of the clean air is formed in the chamber 4. The substrate W is treated in the down flow formed in the chamber 4.

The spin chuck 5 is disposed below the FFU 9. The spin chuck 5 includes a disk-shaped spin base 12 retained in a horizontal attitude, a plurality of chuck pins 13 disposed on the spin base 12, and a spin motor 14 which rotates the spin base 12 about a vertical axis (rotation axis A1) extending through the center of the spin base 12. The spin chuck 5 horizontally holds (clamps) the wafer W at a holding position (the position of the substrate W shown in FIG. 1) above the spin base 12 with the chuck pins 13 kept in contact with a peripheral surface of the substrate W. Further, the spin chuck 5 causes the spin motor 14 to rotate the spin base 12 with the substrate W held on the spin base 12. Thus, the substrate W is rotated about the rotation axis A1. The spin chuck 5 is not limited to the chuck of the clamping type, but may be a vacuum chuck which is adapted to hold the substrate W by sucking a lower surface (back surface) of the substrate W.

The upper surface nozzle 7 is disposed above the spin chuck 5. The treatment unit 2 further includes a treatment liquid pipe 15 connected to the upper surface nozzle 7, a liquid temperature adjusting device 16 which adjusts the temperature of the treatment liquid to be supplied to the treatment liquid pipe 15, a liquid temperature measuring device 17 (another example of the temperature measuring unit) which monitors the temperature of the treatment liquid to be supplied to the treatment liquid pipe 15, and a treatment liquid valve 18 provided in the treatment liquid pipe 15. The liquid temperature adjusting device 16 may be a heater or a cooler. With the treatment liquid valve 18 open, the treatment liquid temperature-adjusted at a predetermined temperature by the liquid temperature adjusting device 16 is spouted from the stationary upper surface nozzle 7 toward the center portion of the upper surface of the substrate W. When the treatment liquid is spouted from the upper surface nozzle 7 with the substrate W being rotated about the rotation axis A1 by the spin chuck 5, the spouted treatment liquid reaches the center portion of the upper surface of the substrate W and then spread outward on the substrate W by a centrifugal force. Therefore, the treatment liquid is moved from the center portion of the upper surface of the substrate W to a peripheral portion of the upper surface of the substrate W. Thus, the treatment liquid having the predetermined temperature is supplied over the entire upper surface of the substrate W. Then, the treatment liquid is spun off around the substrate W and received by the cup 6.

An example of the treatment liquid to be supplied to the upper surface nozzle 7 is a chemical liquid such as hydrofluoric acid (hydrogen fluoride solution). The chemical liquid is not limited to hydrofluoric acid, but may be a liquid containing at least one of sulfuric acid, acetic acid, nitric acid, hydrochloric acid, hydrofluoric acid, ammonia solution, hydrogen peroxide solution, organic acids (e.g., citric acid and oxalic acid), organic alkalis (e.g., tetramethylammonium hydroxide (TMAH)), a surfactant and a corrosion inhibitor. For example, BHF (a liquid mixture containing HF and $NH_4F$), fluoronitric acid (a liquid mixture containing HF and $HNO_3$), SC-1 (a liquid mixture containing $NH_4OH$ and $H_2O_2$), SC-2 (a liquid mixture containing HCl and $H_2O_2$) or TMAH may be supplied to the upper surface nozzle 7. The treatment liquid to be supplied to the upper surface nozzle 7 is not limited to the chemical liquid, but a rinse liquid or other liquid may be supplied to the upper surface nozzle 7. Examples of the rinse liquid include pure water (deionized water), carbonated water, electrolytic ion water, hydrogen water, ozone water and a hydrochloric acid solution having a dilute concentration (e.g., about 10 to about 100 ppm).

Measurement values detected by the air temperature measuring device 10 and the liquid temperature measuring device 17 are inputted to the controller 3. The controller 3 is an example of the temperature controlling unit. The controller 3 is electrically connected to the air temperature adjusting device 11 and the liquid temperature adjusting device 16. The controller 3 controls the air temperature adjusting device 11 and the liquid temperature adjusting device 16 based on the measurement values detected by the air temperature measuring device 10 and the liquid temperature measuring device 17. The controller 3 includes a storage device 19 in which information such as programs is stored, and a CPU 20 (central processing unit 20) which executes the programs stored in the storage device 19. The information stored in the storage device 19 includes a map M1 which defines a relationship between the internal air temperature of the chamber 4 and the temperature of the treatment liquid. The CPU 20 sets a target value of the internal air temperature of the chamber 4 or the temperature of the treatment liquid based on the map M1 and the measurement values detected by the air temperature measuring device 10 and the liquid temperature measuring device 17. After setting the target value, the CPU 20 controls the air temperature adjusting device 11 and the liquid temperature adjusting device 16 so that the internal air temperature of the chamber 4 or the temperature of the treatment liquid is adjusted closer to the target value. Thus, the treatment liquid temperature-adjusted at a predetermined temperature satisfying the relationship defined in the map M1 is supplied from the upper surface nozzle 7 to the substrate W.

Figure 2:
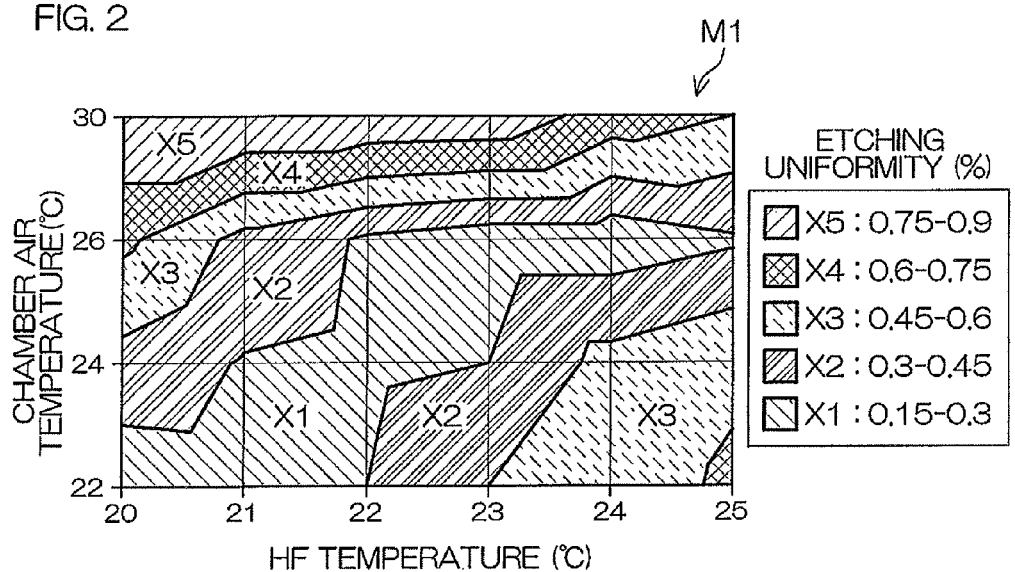
FIG. 2 is a graph showing an exemplary map stored in a controller.
Figure 3:
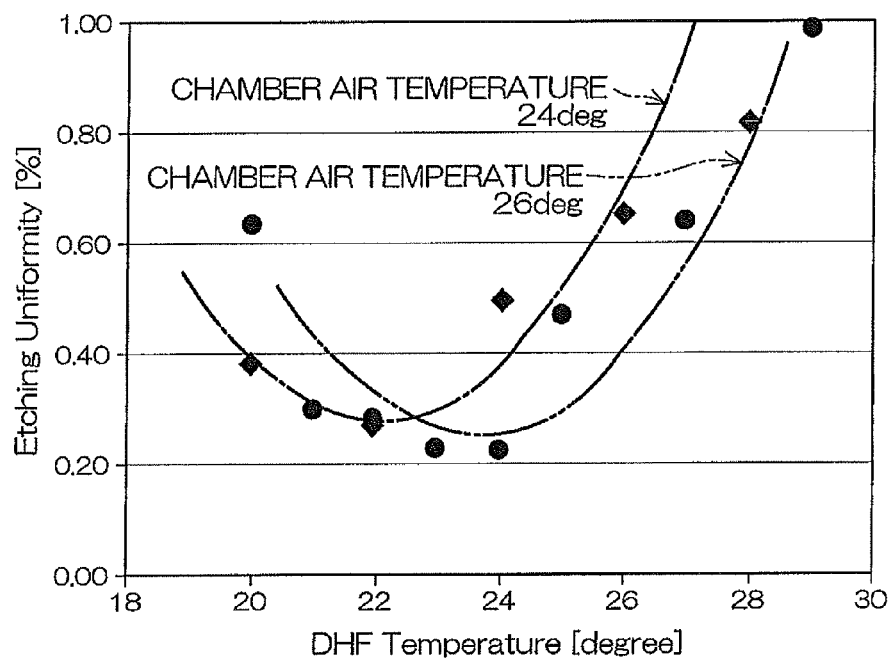
FIG. 3 is a graph showing relationships between the temperature of DHF (dilute hydrofluoric acid) to be supplied to a substrate and the uniformity of etching which were observed when the internal air temperature of the chamber was 24° C. and 26° C.

FIG. 2 is a graph showing an example of the map M1 stored in the controller 3 (storage device 19). FIG. 3 is a graph showing relationships between (measurement values of) the temperature of DHF (dilute hydrofluoric acid) to be supplied to the substrate W and the uniformity of etching which were respectively obtained when the internal air temperature of the chamber 4 was 24° C. and 26° C. The measurement values shown in FIG. 3 are values of etching uniformity observed when DHF solutions (hydrogen fluoride:water=1:50, an example of the etching liquid) having different temperatures were each spouted from the upper surface nozzle 7 toward a center portion of an upper surface of a rotating substrate W and supplied to the entire upper surface of the substrate W. The etching uniformity is expressed by a percentage obtained by dividing a difference between a maximum value and a minimum value of in-plane etching amounts on the substrate surface by an average of the etching amounts. Therefore, the etching uniformity is increased and a variation in the in-plane etching amount on the substrate surface is reduced, as the percentage decreases.

A curve indicating etching uniformity observed when the internal air temperature of the chamber 4 was 24° C. has an upwardly open parabolic shape as indicated by a one-dot-and-dash line in FIG. 3. More specifically, when the temperature of the DHF was about 22° C., the etching uniformity is the most excellent (the percentage is the smallest). As the DHF temperature is away from 22° C., the etching uniformity is deteriorated (the percentage is increased).

Similarly, a curve indicating etching uniformity observed when the internal air temperature of the chamber 4 was 26° C. has an upwardly open parabolic shape as indicated by a two-dot-and-dash line in FIG. 3. More specifically, when the temperature of the DHF was about 24° C., the etching uniformity is the most excellent (the percentage is the smallest). As the DHF temperature is away from 24° C., the etching uniformity is deteriorated (the percentage is increased).

Where the internal air temperature of the chamber 4 is either 24° C. or 26° C., the etching uniformity is the most excellent at a DHF temperature (liquid temperature) lower by 2° C. than the air temperature, and is deteriorated as a value obtained by subtracting the liquid temperature from the air temperature is reduced or increased from 2° C. Thus, the in-plane uniformity of the treatment of the substrate W with the treatment liquid is enhanced when the internal air temperature of the chamber 4 and the treatment liquid temperature satisfy the predetermined relationship.

FIG. 2 shows etching uniformity observed when the internal air temperature of the chamber 4 was changed in a range of from 22° C. to 30° C. and the temperature of the treatment liquid to be supplied to the substrate W was changed in a range of from 20° C. to 25° C. A region X1 is a region in which the etching uniformity is in a range of from 0.15 to 0.3%, and a region X2 is a region in which the etching uniformity is in a range of from 0.3 to 0.45%. A region X3 is a region in which the etching uniformity is in a range of from 0.45 to 0.6%, and a region X4 is a region in which the etching uniformity is in a range of from 0.6 to 0.75%. A region X5 is a region in which the etching uniformity is in a range of from 0.75 to 0.9%.

The controller 3 controls a temperature difference between the air temperature (the internal air temperature of the chamber 4) and the liquid temperature (the temperature of the treatment liquid) so as to satisfy, for example, a relationship in the region X1. In the region X1, a treatment liquid temperature level for a given air temperature level is lower than the given air temperature level. That is, a treatment liquid temperature level is correlated with an air temperature level higher than this treatment liquid temperature level at a given point in the region X1. More specifically, where the air temperature is 26° C., a liquid temperature at which the etching uniformity is 0.15 to 0.3% is about 22° C. to about 25° C. In this case, the controller 3 controls the liquid temperature adjusting device 16, for example, to adjust the temperature of the treatment liquid to be supplied to the substrate W at a temperature within this temperature range. Where the liquid temperature is 23° C., an air temperature at which the etching uniformity is 0.15 to 0.3% is 24° C. to 26° C. In this case, the controller 3 controls the air temperature adjusting device 11, for example, to adjust the temperature of the clean air to be fed from the FFU 9 into the chamber 4 at a temperature within this temperature range.

The controller 3 may change both the air temperature and the liquid temperature or either one of the air temperature and the liquid temperature.

Where the temperature difference is controlled by changing the liquid temperature, for example, the controller 3 sets a target value of the liquid temperature (e.g., a value lower by 2° C. than the air temperature) based on the map M1 and the measurement value detected by the air temperature measuring device 10. Then, the controller 3 judges, based on the measurement value detected by the liquid temperature measuring device 17 and the target liquid temperature value, whether a current liquid temperature value is equal to the target liquid temperature value. If these two values are not equal to each other, the controller 3 causes the liquid temperature adjusting device 16 to change the current liquid temperature value. Thus, the current liquid temperature value is adjusted closer to the target liquid temperature value. If at least one of the air temperature and the liquid temperature is thereafter changed, the controller 3 changes the liquid temperature (current value) closer to the target value again.

Where the temperature difference is controlled by changing the air temperature, the controller 3 sets a target value of the air temperature (e.g., a value higher by 2° C. than the liquid temperature) based on the map M1 and the measurement value detected by the liquid temperature measuring device 17. Then, the controller 3 judges, based on the measurement value detected by the air temperature measuring device 10 and the target air temperature value, whether a current air temperature value is equal to the target air temperature value. If these two values are not equal to each other, the controller 3 causes the air temperature adjusting device 11 to change the current air temperature value. Thus, the current air temperature value is adjusted closer to the target air temperature value. If at least one of the air temperature and the liquid temperature is thereafter changed, the controller 3 changes the air temperature (current value) closer to the target value again.

The controller 3 may preliminarily define an adjustment range for one of the air temperature and the liquid temperature and control the temperature difference by preferentially changing either of the air temperature and the liquid temperature. For example, the controller 3 sets a target liquid temperature value for the air temperature based on the map M1 and, if the target liquid temperature value is within the liquid temperature adjustment range, controls the liquid temperature adjusting device 16 based on the target liquid temperature value. If the target liquid temperature value is outside the liquid temperature adjustment range, the controller 3 sets a target air temperature value for the liquid temperature based on the map M1, and controls the air temperature adjusting device 11 based on the target air temperature value. This makes it possible to properly control the relationship between the air temperature and the liquid temperature while avoiding significant change in treatment liquid temperature. Thus, the substrate treatment can be uniformly and properly performed.

In this embodiment, as described above, the controller 3 sets a target value of the internal air temperature of the chamber 4 or the temperature of the treatment liquid to be spouted from the upper surface nozzle 7 based on the map M1 stored in the storage device 19 and the measurement values detected by the air temperature measuring device 10 and the liquid temperature measuring device 17. Then, the controller 3 controls the air temperature adjusting device 11 and the liquid temperature adjusting device 16, so that the internal air temperature of the chamber 4 or the temperature of the treatment liquid to be spouted from the upper surface nozzle 7 is adjusted closer to the target value. Thus, the treatment liquid temperature-adjusted at a temperature satisfying the relationship defined in the map M1 is supplied to the substrate W.

In the map M1, a given treatment liquid temperature level is correlated with an air temperature level higher than the given treatment liquid temperature level. Therefore, the treatment liquid having a liquid temperature lower than the internal air temperature of the chamber 4 is spouted from the upper surface nozzle 7 to the center portion of the substrate W. While the treatment liquid supplied to the substrate W is moved to the peripheral portion of the substrate W, the heat of the treatment liquid supplied to the substrate W is reduced due to the contact of the treatment liquid with the substrate W or the evaporation of the treatment liquid. However, the internal air temperature of the chamber 4 is higher than the temperature of the treatment liquid to be spouted from the upper surface nozzle 7, so that the treatment liquid present on the substrate W is heated by the ambient atmosphere. Further, a period of contact between the treatment liquid and the ambient atmosphere is increased as the treatment liquid approaches the peripheral portion of the substrate W. Accordingly, the amount of heat supplied to the treatment liquid from the ambient atmosphere is increased as the treatment liquid approaches the peripheral portion of the substrate W. Therefore, the heat removed from the treatment liquid is compensated with the heat supplied from the ambient atmosphere, so that a difference in the temperature of the treatment liquid between the center portion and the peripheral portion of the substrate W is reduced.

Where the internal air temperature of the chamber 4 is higher than the temperature of the treatment liquid present on the substrate W, the treatment liquid is heated by the ambient atmosphere. However, this promotes the evaporation of the treatment liquid, so that the amount of heat removed from the treatment liquid due to the evaporation is increased. In this embodiment, however, the internal air temperature of the chamber 4 is not simply kept at a temperature higher than the treatment liquid temperature, but the treatment liquid is supplied to the substrate W in such a state that the internal air temperature of the chamber 4 and the treatment liquid temperature satisfy the relationship defined in the map M1. This makes it possible to heat the treatment liquid present on the substrate W by the ambient atmosphere while suppressing the evaporation of the treatment liquid. Thus, the uniformity of the temperature of the treatment liquid on the substrate W can be enhanced, thereby enhancing the uniformity of the treatment.

While the embodiment of the present invention has thus been described, it should be understood that the present invention is not limited to the embodiment, but various modifications may be made within the scope defined by the appended claims.

In the embodiment described above, both the air temperature adjusting device 11 and the liquid temperature adjusting device 16 are provided in the treatment unit 2 by way of example. However, the adjustment of the air temperature may be obviated without the provision of the air temperature adjusting device 11, and only the treatment liquid temperature may be adjusted by the liquid temperature adjusting device 16 so as to satisfy the relationship defined in the map M1. Where the internal air temperature of the chamber 4 is not changed by the air temperature adjusting device 11, the air temperature measuring device 10 may be obviated because the air temperature in the clean room is kept generally constant.

The embodiment described above is directed to the case in which the treatment liquid spouted downward from the upper surface nozzle 7 is supplied to the center portion of the upper surface of the substrate W. The treatment liquid having a temperature satisfying the relationship defined in the map M1 may be spouted upward from a lower surface nozzle 21 (see FIG. 1) projecting upward from a center portion of an upper surface of the spin base 12 and supplied to a center portion of the lower surface of the substrate W. The lower surface nozzle 21 is another example of the treatment liquid supplying unit.

In the embodiment described above, the substrate treatment apparatus 1 is adapted to treat the disk-shaped substrate W by way of example. The substrate treatment apparatus 1 may be adapted to treat a polygonal substrate such as for a liquid crystal display device.

While the present invention has been described in detail by way of the embodiment thereof, it should be understood that the embodiment is merely illustrative of the technical principles of the present invention but not limitative of the invention. The spirit and scope of the present invention are to be limited only by the appended claims.

This application corresponds to Japanese Patent Application No. 2012-078182 filed in the Japan Patent Office on Mar. 29, 2012, the disclosure of which is incorporated herein by reference in its entirety.

What is claimed is:

1. A substrate treatment method comprising:
    a holding/rotating step of causing a substrate holding/rotating unit to horizontally hold a substrate in a chamber and rotate the substrate about a vertical rotation axis extending through the substrate;
    a treatment liquid supplying step of, simultaneously with the holding/rotating step, spouting a treatment liquid from a treatment liquid supplying unit toward a center portion of the substrate held by the substrate holding/rotating unit;
    a temperature measuring step of, before the treatment liquid supplying step, causing a temperature measuring unit to measure at least one of an internal air temperature of the chamber and a temperature of the treatment liquid to be spouted from the treatment liquid supplying unit;
    a target value setting step of, after the temperature measuring step, setting a target value of the internal air temperature of the chamber or the temperature of the treatment liquid to be spouted from the treatment liquid supplying unit based on a measurement value detected by the temperature measuring unit and also based on information stored in a storage device which defines a relationship among the air temperature, the treatment liquid temperature, and a treatment uniformity value; and
    a temperature controlling step of, before the treatment liquid supplying step, controlling a temperature adjusting unit so that the internal air temperature of the chamber or the temperature of the treatment liquid to be spouted from the treatment liquid supplying unit is adjusted closer to the target value.

2. The substrate treatment method according to claim 1, wherein the target value is set so that the internal air temperature of the chamber is higher by 2° C. than the temperature of the treatment liquid to be spouted from the treatment liquid supplying unit in the temperature controlling step.

3. The substrate treatment method according to claim 1, wherein the treatment liquid includes hydrofluoric acid.

4. The substrate treatment method according to claim 1, wherein the target value setting step sets the target value such that the temperature of the treatment liquid to be spouted from the treatment liquid supplying unit is lower than the internal air temperature of the chamber.

* * * * *